(12) United States Patent
Huang (10) Patent No.: US 8,339,215 B2
(45) Date of Patent: Dec. 25, 2012

(54) CHARGE DOMAIN FILTER WITH CONTROLLABLE TRANSFER FUNCTIONS AND TRANSFER FUNCTION CONTROL METHODS THEREOF

(75) Inventor: Ming-Feng Huang, Jhubei (TW)

(73) Assignee: Industrial Technology Research Institute, Hsinchu (TW)

( * ) Notice: Subject to any disclaimer, the term of this patent is extended or adjusted under 35 U.S.C. 154(b) by 481 days.

(21) Appl. No.: 12/758,024

(22) Filed: Apr. 11, 2010

(65) Prior Publication Data

US 2011/0248768 A1 Oct. 13, 2011

(51) Int. Cl.
*H01P 1/10* (2006.01)
*H03K 5/00* (2006.01)
(52) U.S. Cl. ........................... 333/101; 327/554
(58) Field of Classification Search ............... 333/101, 333/103, 173, 175; 327/554; 708/819
See application file for complete search history.

(56) References Cited

U.S. PATENT DOCUMENTS

| | | | | |
|---|---|---|---|---|
| 5,325,322 | A * | 6/1994 | Bailey et al. | 708/819 |
| 6,032,171 | A * | 2/2000 | Kiriaki et al. | 708/819 |
| 6,856,925 | B2 | 2/2005 | Wada | |
| 7,006,813 | B2 | 2/2006 | Staszewski | |
| 7,327,182 | B2 | 2/2008 | Dosho | |
| 7,932,773 | B2 * | 4/2011 | Iida et al. | 327/551 |
| 7,941,475 | B2 * | 5/2011 | Bagheri et al. | 708/819 |
| 2011/0121893 | A1 * | 5/2011 | Huang | 327/554 |
| 2011/0291750 | A1 * | 12/2011 | Huang | 327/554 |

OTHER PUBLICATIONS

Jakonis et al., A 2.4-GHz RF Sampling Receiver Front-End in 0.18-um CMOS, IEEE Journal of Solid-State Circuits, Jun. 2005. pp. 1265-1277, vol. 40, No. 6, USA.
Park et al., Non-Decimation FIR Filter for Digital RF Sampling Receiver with wideband Operation Capability, 2009 IEEE Radio Frequency Integrated Circuits Symposium, 2009, pp. 487-490, IEEE, USA.
Huang et al., A Discrete-Time AAF with Clock-Efficient Charge-Domain Filter for High Attenuation and Bandwidth, 2009 IEEE Asian Solid-State Circuits Conference, 2009, pp. 41-44, IEEE, USA.

* cited by examiner

*Primary Examiner* — Dean O Takaoka
*Assistant Examiner* — Alan Wong
(74) *Attorney, Agent, or Firm* — Wang Law Firm, Inc.; Li K. Wang; Stephen Hsu (57) ABSTRACT

A charge domain filter with controllable transfer function is disclosed. The charge domain filter has a plurality of switched-capacitor networks, a switching device and a current adder. The switched-capacitor networks are interleaving controlled, and each have an input terminal and an output terminal, and the input terminals of all of the switched-capacitor networks are connected together to be coupled to an input signal. The switching device is designed for transfer function control, and is operated according to a switch control signal. The switching device determines connections between the output terminals of the switched-capacitor networks and how the output terminals of the switched-capacitor networks are coupled to the current adder and thereby generates at least one current adder input. The at least one current adder input is received by the current adder, and the current adder outputs an output signal accordingly.

16 Claims, 10 Drawing Sheets

| | N=16, M=8, and 8 cument adder inputs are generated ||||
|---|---|---|---|
| | States of the switching device | Signal transfer function | Leakage Transfer Function |
| Case 1 | P=8 | $\simeq H(z)$ | $\simeq \sum_{i=0}^{8-1} z^{-i}$ |
| Case 2 | P=4 | $\simeq H(z) \times \sum_{i=0}^{2-1} z^{-i}$ | $\simeq \sum_{i=0}^{8-1} z^{-i}$ |
| Case 3 | P=2 | $\simeq H(z) \times \sum_{i=0}^{4-1} z^{-i}$ | $\simeq \sum_{i=0}^{8-1} z^{-i}$ |
| Case 4 | P=1 | $\simeq H(z) \times \sum_{i=0}^{8-1} z^{-i}$ | $\simeq \sum_{i=0}^{8-1} z^{-i}$ |

CHARGE DOMAIN FILTER WITH CONTROLLABLE TRANSFER FUNCTIONS AND TRANSFER FUNCTION CONTROL METHODS THEREOF

TECHNICAL FIELD

The disclosure relates to charge domain filters, and in particular relates to charge domain filters with controllable transfer functions.

BACKGROUND

Switched-capacitor networks are generally applied in signal filtering. Signal filters with the switched-capacitor networks are also named charge domain filters.

Figure 1A:
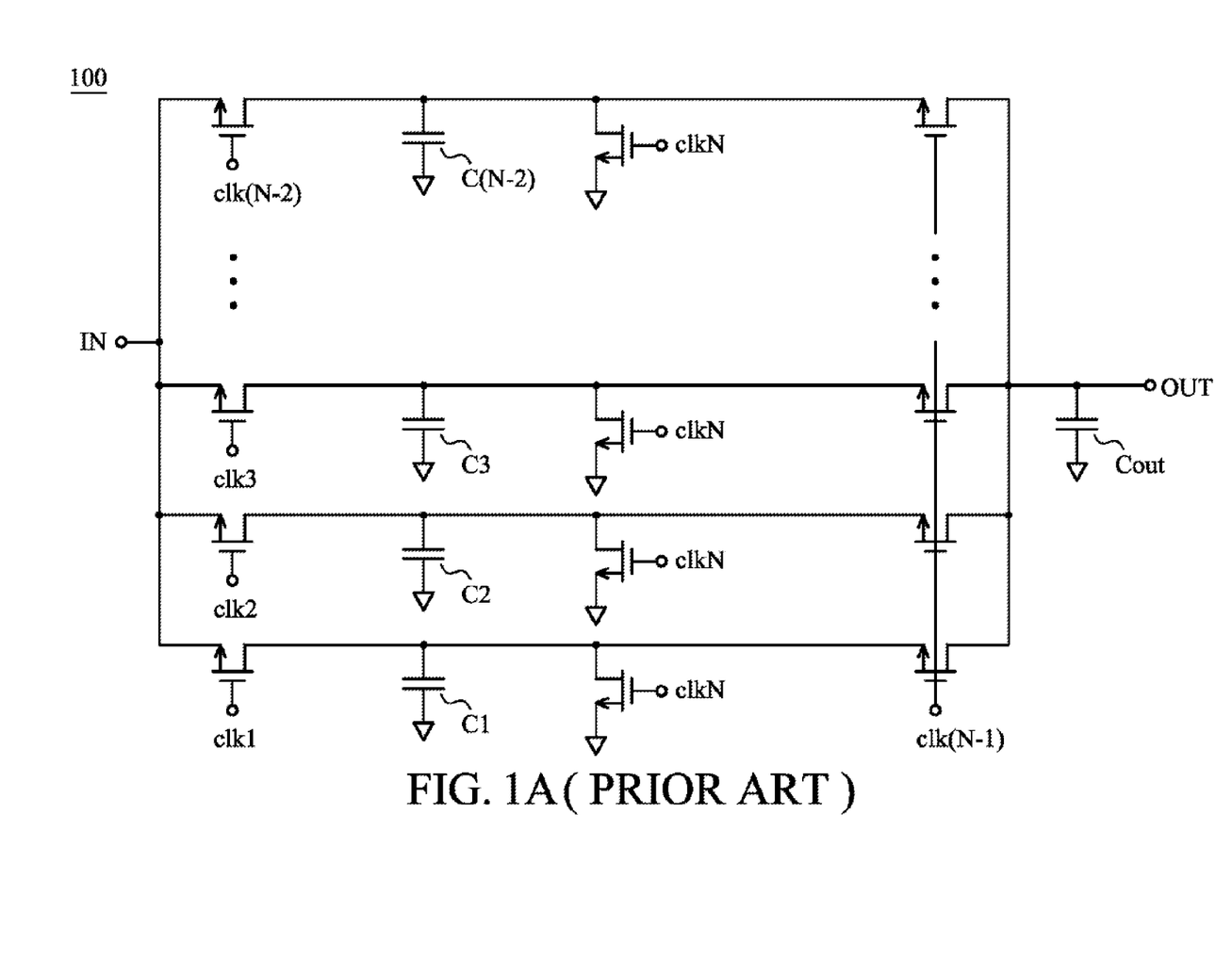
FIG. 1A depicts an example of a switched-capacitor network.
Figure 1B:
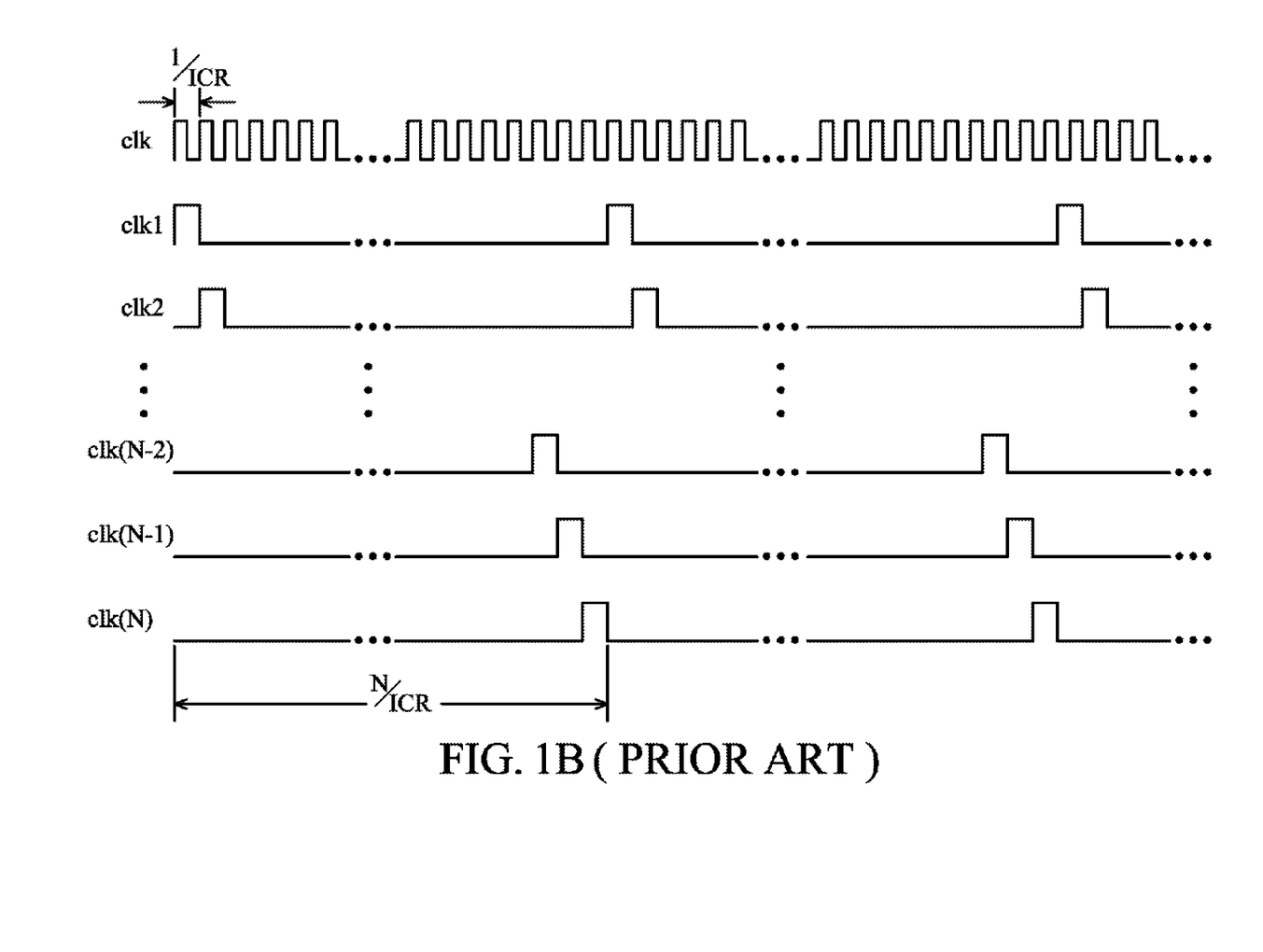
FIG. 1B shows control signal waveforms for the circuit of FIG. 1A.

FIG. 1A depicts an example of a switched-capacitor network and FIG. 1B shows control signal waveforms for the circuit of FIG. 1A. As shown, N control signals clk1 ... clkN are used in the control of the switched-capacitor network 100. FIG. 1B shows that the N clock signals clk1 ... clkN are periodic signals and are active at different times. Thus, N control phases are provided. The control signals clk1 ... clk(N−2) provide signal input phases. According to the control signals clk1 ... clk(N−2), an input signal IN electrifies the capacitors C1 ... C(N−2) in turn. The control signal clk(N−1) provides a charge summation phase. According to the control signal clk(N−1), the electric charges stored in the capacitors C1 ... C(N−2) is further transmitted to the capacitor Cout at the output terminal (OUT) of the switched-capacitor network 100. The control signal clkN provides a reset phase. According to the control signal clkN, the capacitors C1 ... C(N−2) are discharged for the succeeding signal input phases. Referring to the first waveform shown in FIG. 1B, a system clock clk is shown. The input clock rate (represented by ICR) determines the length of a clock period (1/ICR). Because a time period N/ICR is required to refresh the output signal OUT, a sample rate decimation exists in the switched-capacitor network 100.

Figure 2:
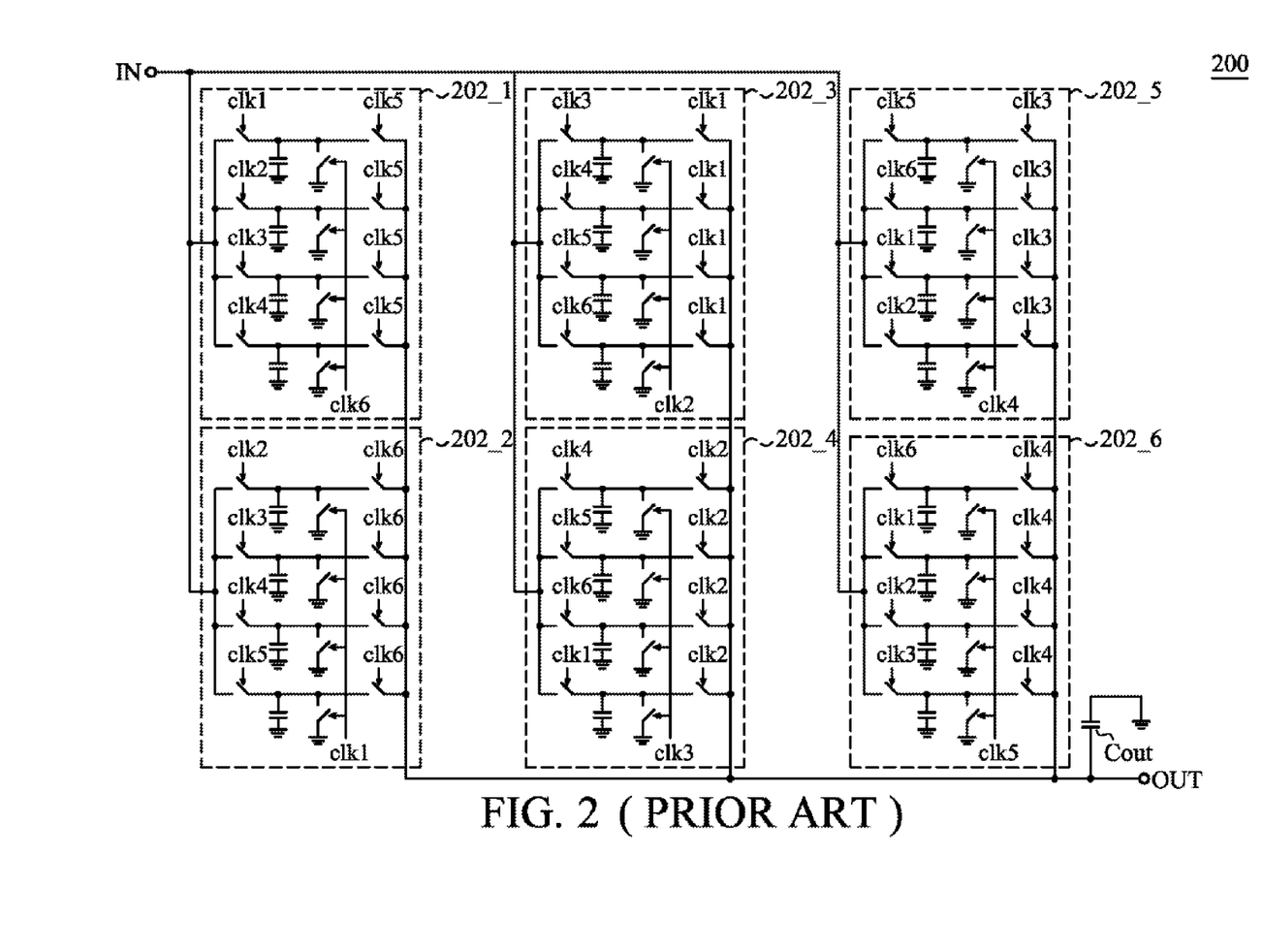
FIG. 2 shows a charge domain filter 200 using the interleaving technique.

To solve the sample rate decimation, several techniques have been developed. One well-known technique is the "interleaving technique." FIG. 2 shows a charge domain filter 200 using the interleaving technique. There are six circuits 202_1 ... 202_6, which are identical and share an output capacitor Cout, and each requires six phases (clk1 ... clk6). It has to be noted that the circuits 202_1 ... 202_6 are controlled in an interleaving form, to make the circuits 202_1 ... 202_6 connect to the output capacitor Cout at different times. When looking at the turning-on order of the switches of the circuit 202_1 and the turning-on order of the switches of the circuit 202_2, there is one phase shift. Similarly, when looking at the turning-on order of the switches between the circuits 202_2 and 202_3, between the circuits 202_3 and 202_4, between the circuits 202_4 and 202_5, between the circuits 202_5 and 202_6, and between the circuits 202_6 and 202_1, there is one phase shift. The circuits 202_1, 202_2, 202_3, 202_4, 202_5 and 202_6 are connected to the output capacitor Cout according to the control signals clk5, clk6, clk1, clk2, clk3, and clk4, respectively. The output signal OUT is refreshed at every control phase, so that no sample rate decimation occurs in the charge domain filter.

In addition to the basic switched-capacitor network 100 or the interleaving technique of FIG. 2, there are many variants and types of charge domain filters. For charge domain filter designs, there are two important issues: leakage reduction and controllable transfer functions. This specification could provide charge domain filters with good leakage reduction performance and providing controllable transfer functions.

SUMMARY

Charge domain filters with controllable transfer functions are provided.

An exemplary embodiment of a charge domain filter comprises a plurality of switched-capacitor networks, a switching device, and a current adder. The switched-capacitor networks are controlled in an interleaving form, and each have an input terminal and an output terminal, and the input terminals of all of the switched-capacitor networks are connected together to be coupled to an input signal. The switching device is designed for transfer function control, and is operated according to a plurality of switch control signals. The switching device determines connections between the output terminals of the switched-capacitor networks and how the output terminals of the switched-capacitor networks am coupled to the current adder and thereby generates at least one current adder input. The at least one current adder input is received by the current adder, and the current adder outputs an output signal accordingly.

By setting the switch control signals, the transfer function between the output signal and the input signal is controllable.

In an exemplary embodiment, the switching device connects the output terminals of every P of the switched-capacitor networks and individually couples the output terminals of the switched-capacitor networks to the current adder to provide M current adder inputs. M is a total number of the switched-capacitor networks. P is a factor of M. Note that the every P switched-capacitor networks having connected output terminals are operated in an interleaving form. The current adder may sum up voltage values of the M current adder inputs to generate the output signal.

In another exemplary embodiment, the switching device connects the output terminals of every P of the switched-capacitor networks together to generate Q current adder inputs for the current adder. P and Q are integers, P is greater than 1 and a product of P and Q equals to a total number of the switched-capacitor networks. Note that the every P switched-capacitor networks having connected output terminals are operated in an interleaving form. The current adder may sum up voltage values of the Q current adder inputs to generate the output signal.

In another exemplary embodiment, a method determining transfer function of a charge domain filter is disclosed.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION OF THE EMBODIMENTS

The following description shows several exemplary embodiments carrying out the disclosure. This description is made for the purpose of illustrating the general principles of the disclosure and should not be taken in a limiting sense. The scope of the disclosure is best determined by reference to the appended claims.

Figure 3:
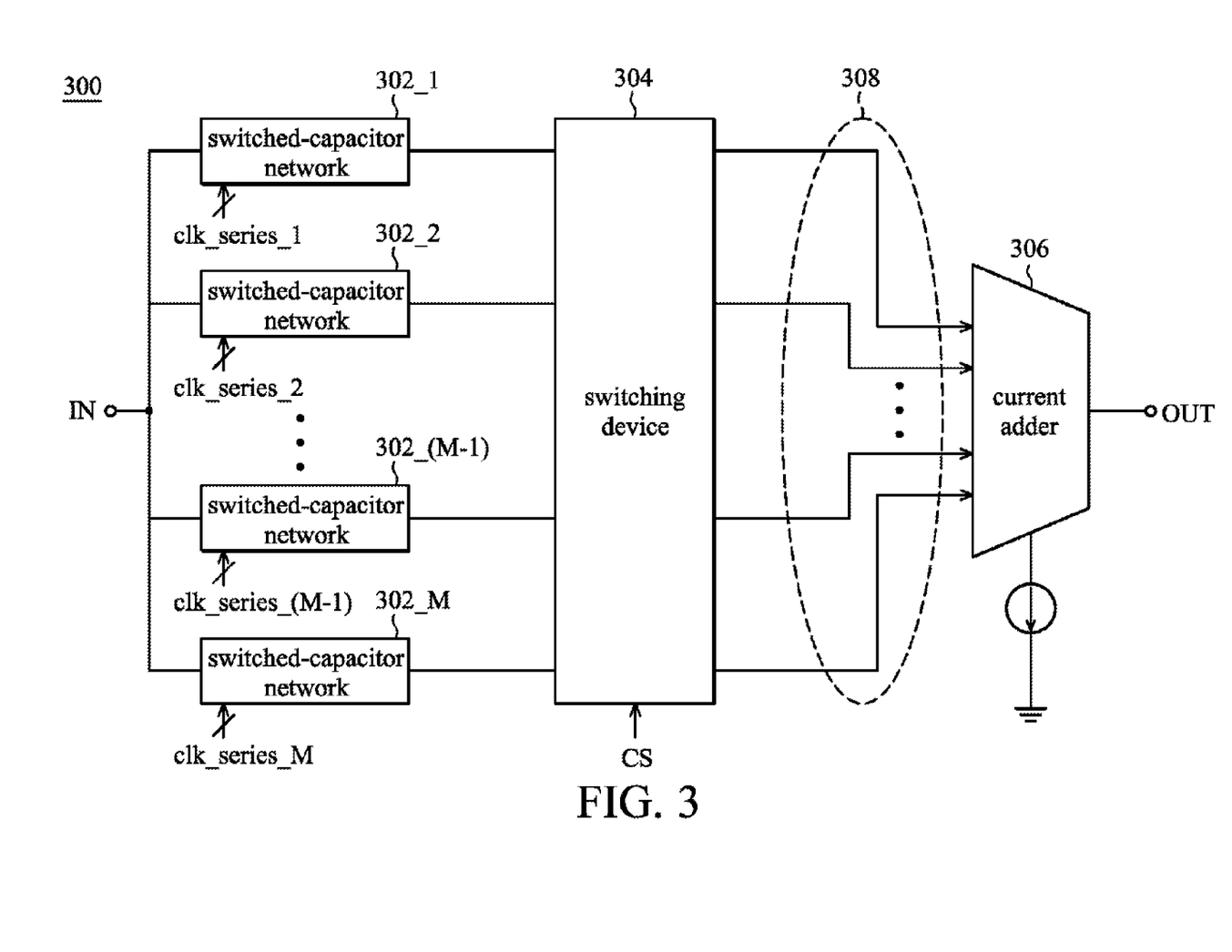
FIG. 3 depicts an exemplary embodiment of a charge domain filter of the disclosure.

FIG. 3 depicts an exemplary embodiment of a charge domain filter of the disclosure. The charge domain filter 300 comprises a plurality of switched-capacitor networks 302_1 . . . 302_M, a switching device 304, and a current adder 306.

The switched-capacitor networks 302_1 . . . 302_M each have an input terminal and an output terminal, and the input terminals of all of the switched-capacitor networks 302_1 . . . 302_M may be connected together to receive an input signal IN, wherein the input signal IN may be directly connected at the input terminals of all of the switched-capacitor networks 302_1 . . . 302_M, or, in other embodiments, the input signal IN is indirectly coupled to the connected input terminals of the switched-capacitor networks 302_1 . . . 302_M via other electronic components or devices. Note that the switched-capacitor networks 302_1 . . . 302_M are interleaving controlled. For each of the switched-capacitor networks 302_1 . . . 302_M, N control phases (clk1 . . . clkN) are used. The switched-capacitor networks 302_1 . . . 302_M may have identical circuits, but the switch turning-on orders thereof are distinct. The control signal pins of each of the switched-capacitor networks 302_1 . . . 302_M are coupled to the control signals clk1 . . . clkN in different orders. The clock series clk_series_1 . . . clk_series_M are presented to show the different orders. The clock series clk_series_1 connects the control signals to the control signal pins of the switched-capacitor network 302_1 in an order: clk1, clk2 . . . clkN. The clock series clk_series_2 connects the control signals to the control signal pins of the switched-capacitor network 302_2 in an order: clk(1+N/M), clk(2+N/M) . . . clkN, clk1, clk2 . . . clk(N/M). Similarly, the clock series clk_series_(M−1) connects the control signals to the control signal pins of the switched-capacitor network 302_(M−1) in an order: clk(1+(M−2)N/M), clk(2+(M−2)N/M) . . . clkN,clk1, clk2 . . . clk((M−2)N/M). The clock series clk_series_M connects the control signals to the control signal pins of the switched-capacitor network 302_M in an order: clk(1+(M−1)N/M), clk(2+(M−1)N/M) . . . clkN,clk1, clk2 . . . clk((M−1)N/M).

The number N may equal to the number M, or, M may be one of the factors of N. It has to be noted that the specification does not intend to limit the circuits of the switched-capacitor networks 302_1 . . . 302_M. Any well-know switched-capacitor network is suitable to be applied in the disclosure. Furthermore, in some embodiments, the switched-capacitor networks 302_1 . . . 302_M may have distinct output capacitors, or, each may be formed by a distinct structure.

The switching device 304 is designed for transfer function control, and is operated according to at least one switch control signal CS. The switching device 304 determines connections between the output terminals of the switched-capacitor networks 302_1 . . . 302_M and how the output terminals of the switched-capacitor networks 302_1 . . . 302_M are coupled to the current adder 306, and thereby generates at least one current adder input 308 for the current adder 306. According to the at least one current adder input 308 received, the current adder 306 outputs an output signal OUT accordingly. In some embodiments, the current adder 306 may perform a voltage summation on the at least one current adder input 308, and the output signal OUT may be the voltage sum of the at least one current adder input 308. Note that the switched-capacitor networks having connected output terminals are operated in an interleaving form.

In some embodiments, the amount of the generated current adder inputs 308 equal to the amount of the switched-capacitor networks 302_1 . . . 302_M because the output terminals of the switched-capacitor networks 302_1 . . . 302_M are individually coupled to the current adder 306 as M current adder inputs no matter how the output terminals of the switched-capacitor networks 302_1 . . . 302_M are connected to one another. For example, the switching device 304 may connect the output terminals of every P of the switched-capacitor networks 302_1 . . . 302_M (where P is one of the factors of M) in advance, and individually couples the output terminals of all of the M switched-capacitor networks 302_1 . . . 302_M to the current adder 306 as M inputs. In a special case (P=1), the switching device 304 may individually couples the output terminals of the switched-capacitor networks 302_1 . . . 302_M to the current adder 306 without connecting the output terminals of the switched-capacitor networks 302_1 . . . 302_M to one another in advance.

In other embodiments, the amount of the generated current adder inputs 308 does not equal to the amount of the switched-capacitor networks 302_1 . . . 302_M. The connections between the output terminals of the switched-capacitor networks 302_1 . . . 302_M reduce the amount of signals transmitting to the current adder 306. The connected output terminals provide a combined signal as one input of the current adder 306. For example, the switching device 304 may connect the output terminals of every P of the switched-capacitor networks 302_1 . . . 302_M to generate Q current adder inputs 308 for the current adder 306, where P and Q are integers and P is greater than 1, and a product of P and Q equals to the total number of the switched-capacitor networks (P×Q=M). In a special case (P=M), the switching device 304 may connect (for example, direct short) the output terminals of all of the switched-capacitor networks 302_1 . . . 302_M to generate a single signal as the at least one current adder input 308.

By setting the switch control signal CS, the transfer function between the output signal OUT and the input signal IN is controllable.

Figure 4A:
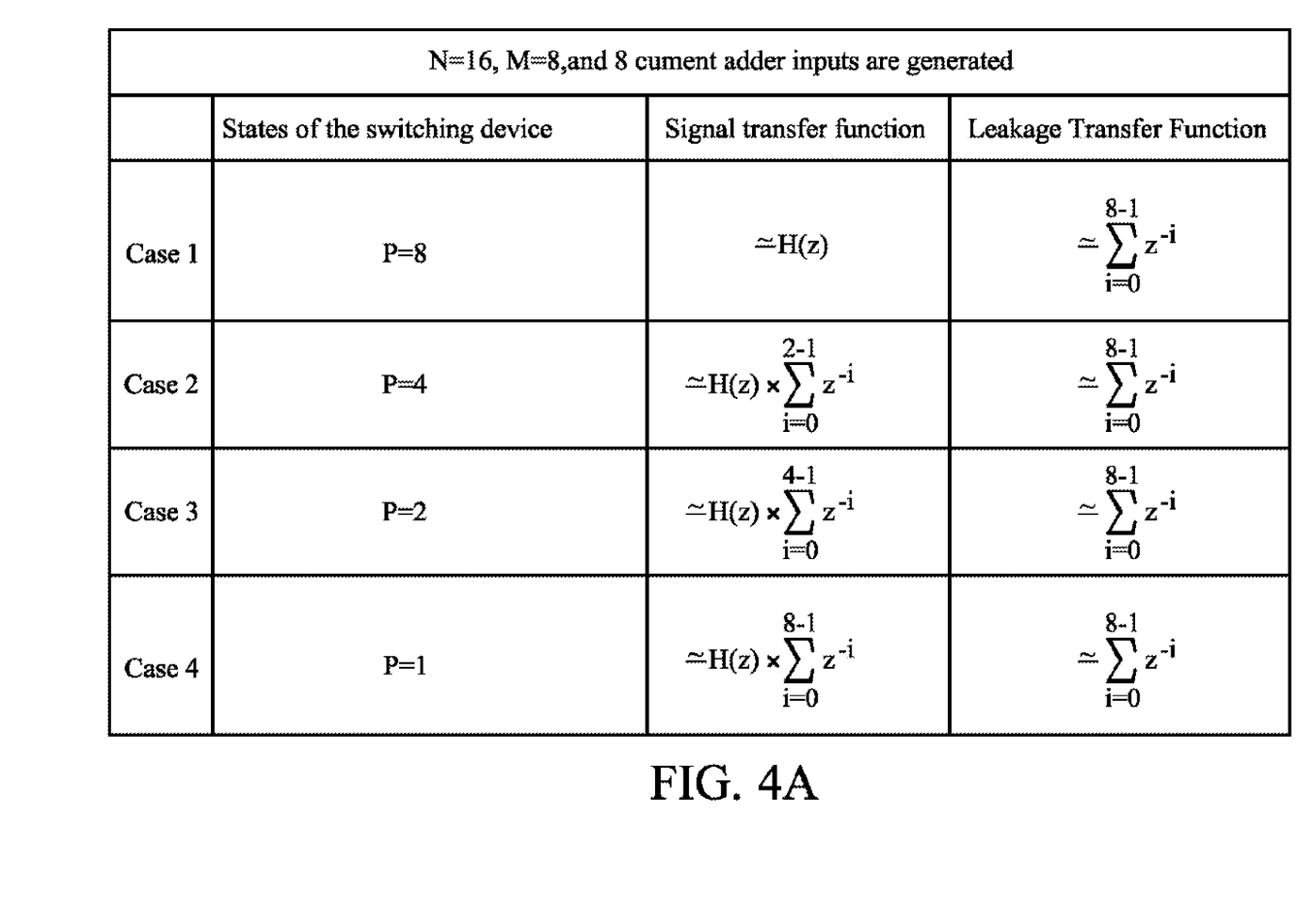
FIGS. 4A, 4B and 4C are presented to discuss an embodiment of the charge domain filter 300.
Figure 4B:
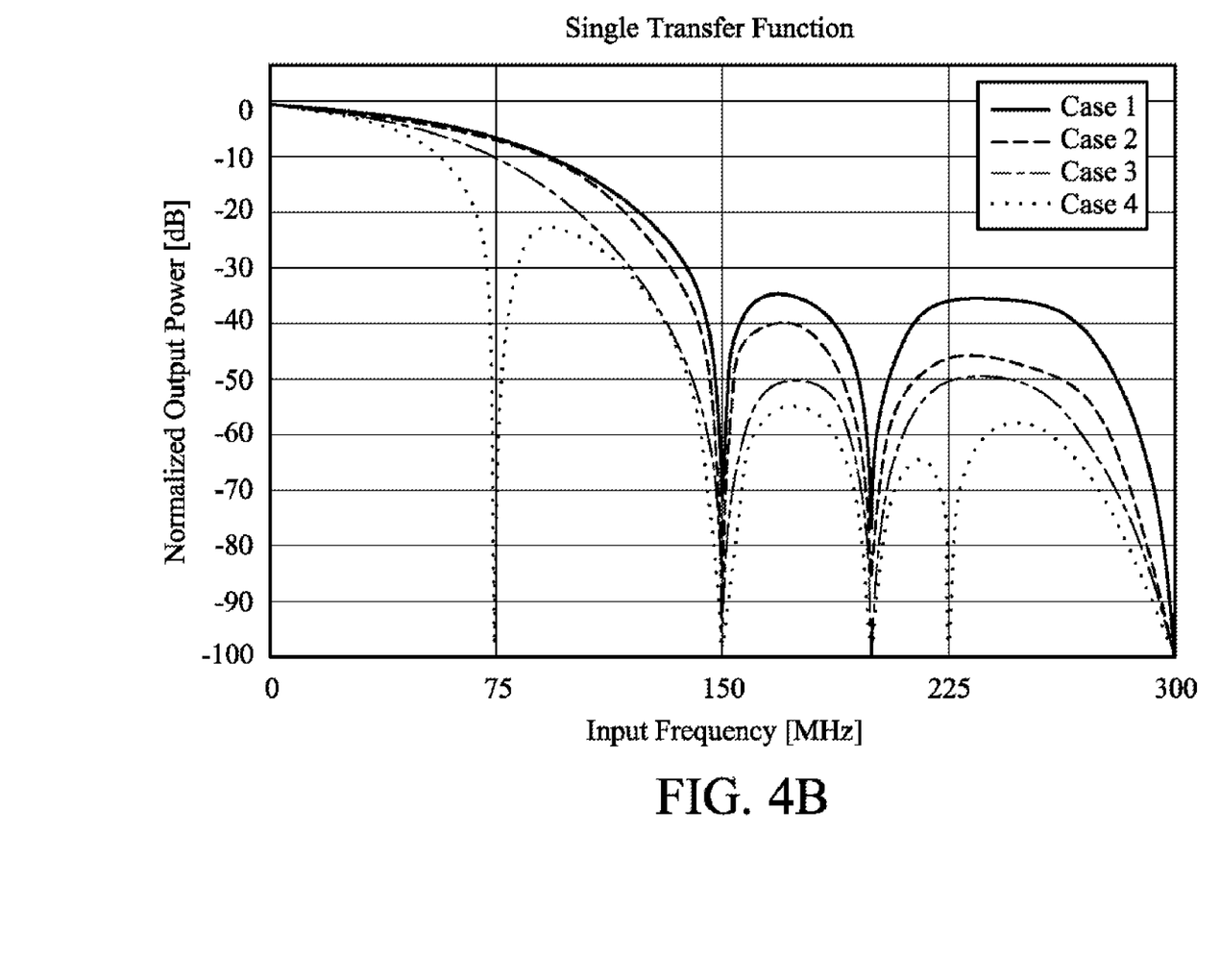
Figure 4C:
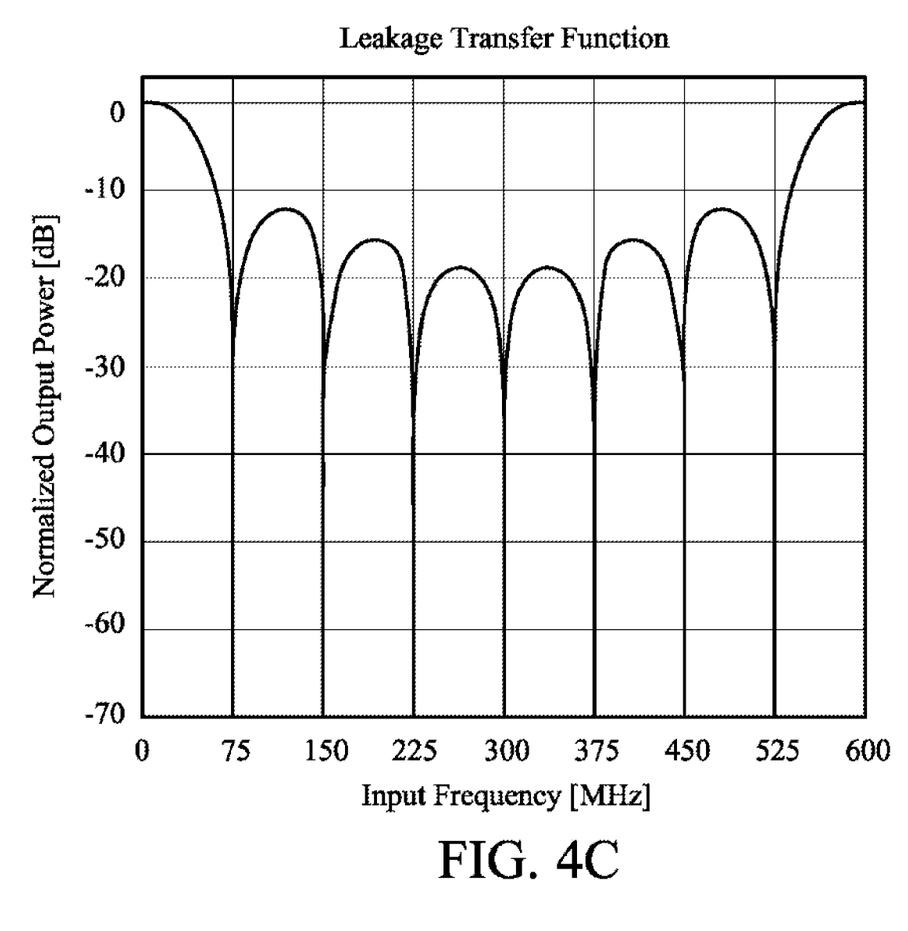

FIGS. 4A, 4B and 4C are presented to discuss an embodiment of the charge domain filter 300, wherein the number of control phases, N, is 16, and the number of switched capacitor networks, M, is 8. Referring to FIG. 4A, four cases are presented by setting the switch control signal CS, wherein the switching device 304 connects the output terminals of every P of the switched-capacitor networks 302_1 . . . 302_M (where P is one of the factors of M, may be 1, 2, 4 or 8) in advance, and individually couples the output terminals of the eight switched-capacitor networks to the current adder 306 as 8 inputs no matter how the output terminals of the eight switched-capacitor networks are connected to one another. In case 1, P=8, the switching device 304 connects (direct short) the output terminals of the 8 switched-capacitor networks together before coupling the output terminals of the eight switched-capacitor networks to the current adder 306 as 8 inputs. In case 2, P is 4, the switching device 304 connects the output terminals of every 4 switched-capacitor networks before coupling the output terminals of the eight switched-capacitor networks to the current adder 306 as 8 inputs. The every 4 switched-capacitor networks having connected output terminals are controlled in an interleaving form. In case 3, P=2, the switching device 304 connects the output terminals of every 2 switched-capacitor networks before coupling the output terminals of the eight switched-capacitor networks to the current adder 306 as 8 inputs. The every 2 switched-capacitor networks having connected output terminals are controlled in an interleaving form. In case 4, P=1, the switching device 304 individually couples the output terminals of the 8 switched-capacitor networks to the current adder 306 to generate 8 current adder inputs (308) without connecting the output terminals of the eight switched-capacitor network to one another in advance.

As for the signal transfer function, the number of zeros varies in the four cases. Referring to FIG. 4B, FIG. 4B shows how the signal transfer functions of the different cases. In this embodiment, the input clock rate is 1200 MHz (ICR=1200 MHz). Case 1 provides the widest bandwidth while case 4 provides the best stop-band signal attenuation. The user can easily control the performance of the transfer function by setting the switch control signal CS of the switching device 304. The controllable transfer function is very convenient for the user because in conventional techniques the transfer function is fixed after the fabrication of the charge domain filter. The disclosed techniques improve the flexibility of the filter coefficients.

As for the leakage transfer function (the leakage may be caused by process variations or substrate coupling or so on), the techniques disclosed in the specification have good leakage reduction performance. Referring to FIG. 4A, the four cases have similar leakage transfer functions. FIG. 4C shows the transfer function for leakage, where ICR is 1200 MHz. The waveform of FIG. 4C shows that the disclosed techniques have good folding noise reduction performances.

In the embodiments wherein the amount of generated current adder inputs 308 does not equal to the amount of the switched-capacitor networks 302_1 . . . 302_M, said leakage transfer function may be affected. However, the user can use the at least on control signal CS to choose the best architecture for the current application.

Figure 5:
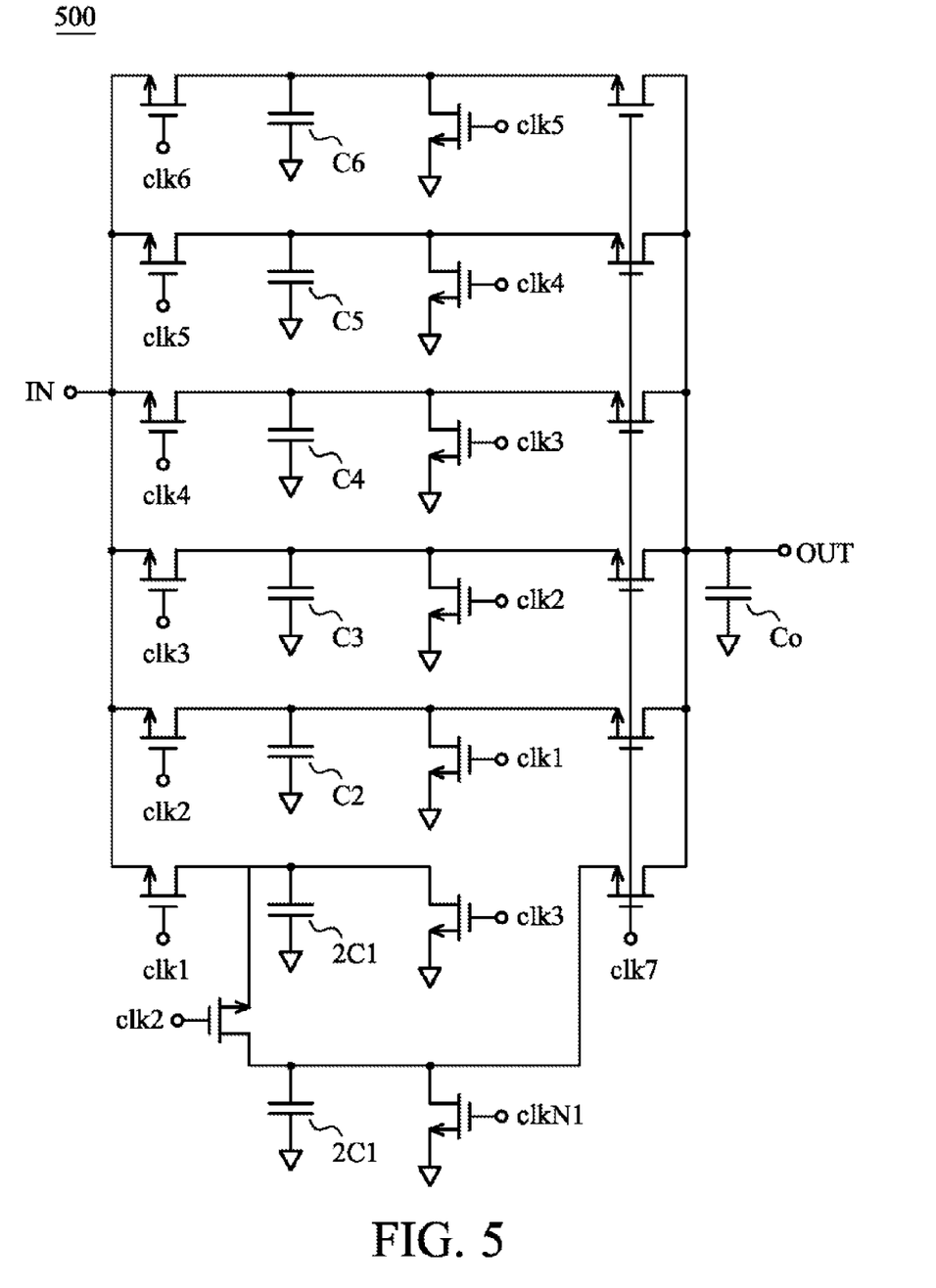
FIG. 5 depicts a special switched-capacitor network, named a clock-efficient charge domain filter (CECDF)

FIG. 5 depicts a special switched-capacitor network, named a clock-efficient charge domain filter (CECDF). The CECDF 500 provides six capacitor coefficients (C1 . . . C6) and is controlled by seven control phases (clk1 . . . clk7). In comparison with conventional techniques shown in FIG. 1A, one control phase—the reset phase—is saved. Based on the structure disclosed in FIG. 3, a charge domain filter 600 is presented in FIG. 6A, wherein CECDFs are applied in the switched-capacitor network implementation. In the charge domain filter 600, seven CECDFs 500_1 . . . 500_7 are required and the CECDFs are interleaving controlled. The switching device 604 comprises switches SW1,1 . . . SW1,7 and switches SW2,1 . . . SW2,7. According to the at least one control signal CS from a controller 610, the switches SW1,1 . . . SW1,7 and the switches SW2,1 . . . SW2,7 are controlled. In case 1, all of the switches SW1,1 . . . SW1,7 are turned on to direct short the output terminals of the CECDFs 500_1 . . . 500_7, and all of the switches SW2,1 . . . SW2,7 are turned on to connect the seven output terminals of the CECDFs 500_1 . . . 500_7 to the current adder 606 as seven inputs. A signal transfer function $H_1(z)$ is provided by the architecture introduced in case 1. In case 2, all of the switches SW1,1 . . . SW1,7 are turned off and the switches SW2,1 . . . SW2,7 are turned on. Thus, the output terminals of the CECDFs 500_1 . . . 500_7 are connected to the current adder 606 individually without connecting to one another in advance. The architecture introduced by case 2 provides a signal transfer function $H_2(z)$.

Figure 6A:
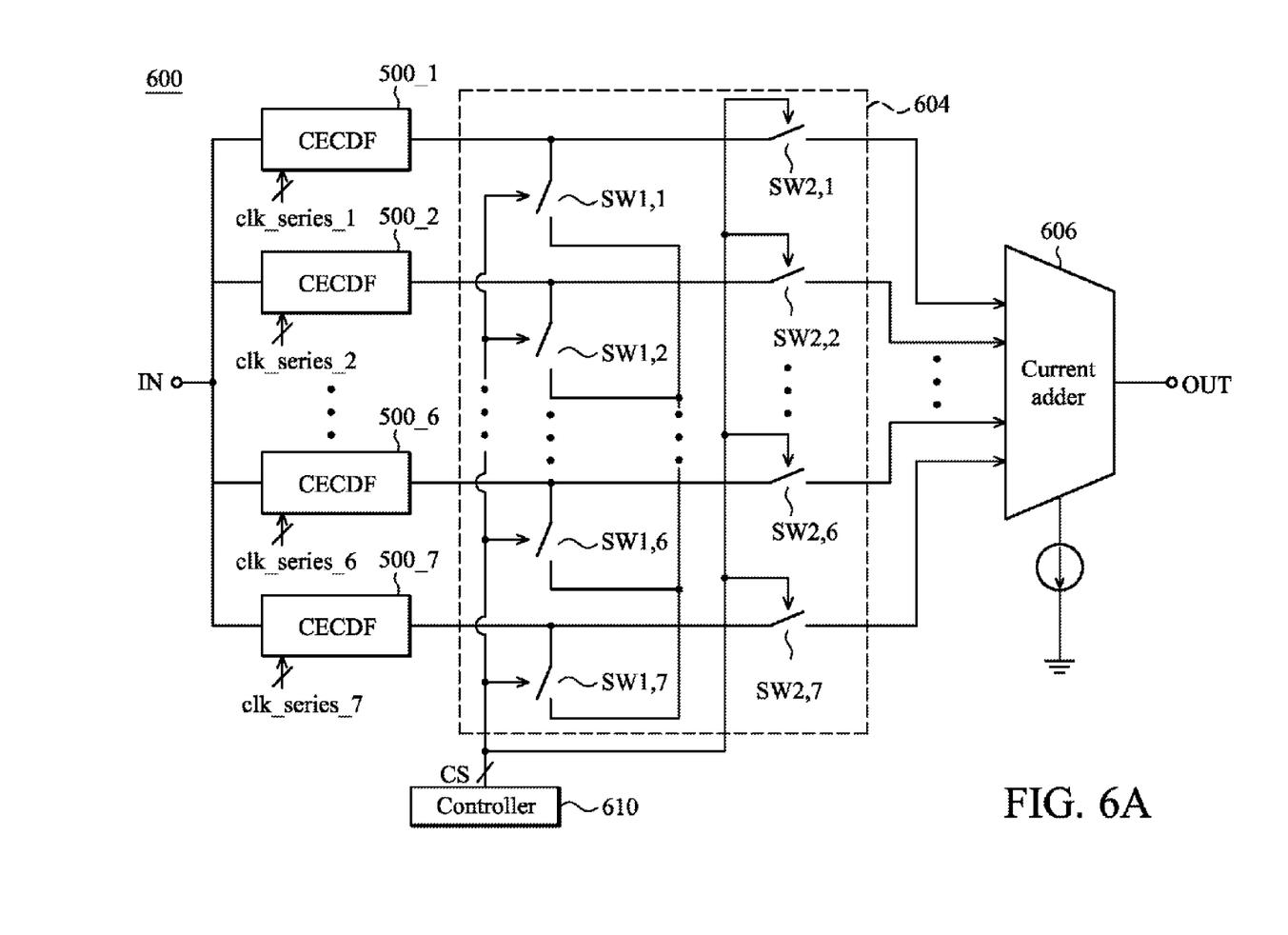
FIG. 6A shows a charge domain filter 600 constructed according to the circuit of FIG. 3, wherein the switched-capacitor networks are implemented by CECDFs introduced in FIG. 5.
Figure 6B:
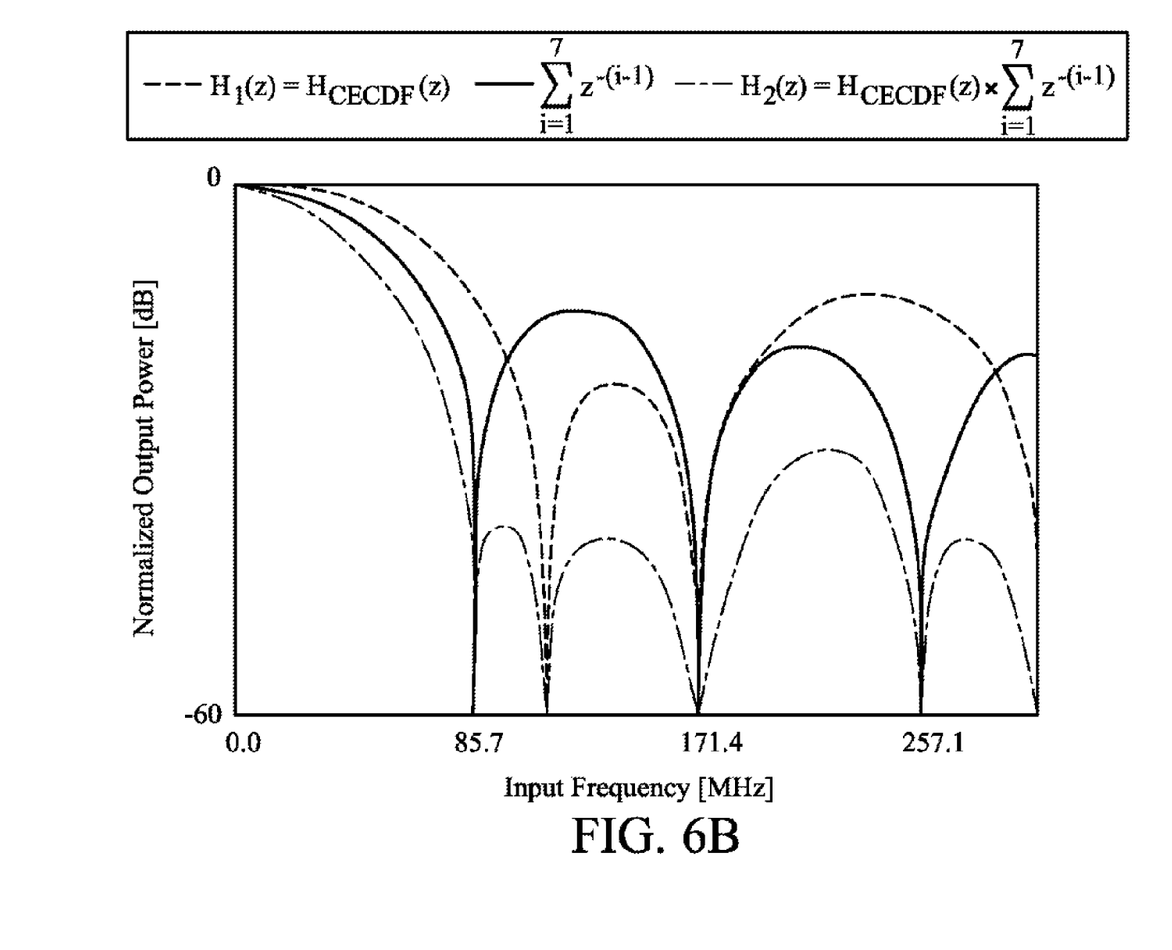
FIG. 6B depicts the available transfer functions provided by the circuit of FIG. 6A.

FIG. 6B depicts the transfer functions $H_1(z)$ and $H_2(z)$, where ICR is 600 MHz. The transfer function $H_1(z)$ equals to the transfer function of one CECDF circuit, $H_{CECDF}(z)$. In comparison with the transfer function $H_1(z)$, the transfer function $H_2(z)$ further introduces additional zeros, and the bandwidth and the signal attenuation are different from those of case 1. The user can select one of the signal filtering solutions by setting the switch control signal CS without additional effort. Furthermore, when mismatch exists in the filter, a leakage transfer function provided by both cases 1 and 2 is shown as the waveform of a solid line.

In addition, the charge domain filter 600 of FIG. 6A may further provide another architecture (case 3), in which all of the switches SW1,1 . . . SW1,7 are turned on, and only one of the switches SW2,1 . . . SW2,7 is turned on while the rest of the switches SW2,1 . . . SW2,7 are turned off. Case 3 may still provides a signal transfer function of $H_1(z)$ but is incapable of mismatch reduction. Case 3 provides another signal filtering solution to be selected by the user.

When all of the CECDFs 500_1 . . . 500_7 are of the same circuit, another advantage of the charge domain filter 600 is provided that no sample rate decimation occurs at the output terminal (OUT). However, in other embodiments, the output capacitors of the CECDFs 500_1 . . . 500_7 may be unequal-sized. Accordingly, the sample rate of the output signal OUT may be altered to deviate from the sample rate non-decimation status.

Note that the CECDF 500 and the number of introduced control phases do not intend to limit the scope of the disclosure. CECDFs of other structures can also be used as the switched-capacitor networks of the disclosed charge domain filter.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A charge domain filter with controllable transfer function, comprising
    a plurality of switched-capacitor networks, each having an input terminal and an output terminal, wherein the input terminals of all of the switched-capacitor networks are connected together to be coupled to an input signal, and the switched-capacitor networks are interleaving controlled;
    a current adder, receiving at least one current adder input to output an output signal; and
    a switching device for transfer function control, operated according to a switch control signal, determining connections between the output terminals of the switched-capacitor networks and how the output terminals of the switched-capacitor networks are coupled to the current adder and thereby generating the at least one current adder input.

2. The charge domain filter as claimed in claim 1, wherein, by setting the switch control signals, the switching device connects the output terminals of every P of the switched-capacitor networks together and individually couples the output terminals of the switched-capacitor networks to the current adder to provide M current adder inputs, where M is a total number of the switched-capacitor networks, P is a factor of M, and the every P switched-capacitor networks having connected output terminals are operated in an interleaving form.

3. The charge domain filter as claimed in claim 2, wherein the current adder sums up voltage values of the M current adder inputs to generate the output signal.

4. The charge domain filter as claimed in claim 1, wherein, by setting the switch control signals, the switching device connects the output terminals of every P of the switched-capacitor networks together to generate Q current adder inputs for the current adder, wherein P and Q are integers, P is greater than 1 and a product of P and Q equals to a total number of the switched-capacitor networks, and the every P switched-capacitor networks having connected output terminals are operated in an interleaving form.

5. The charge domain filter as claimed in claim 4, wherein the current adder sums up voltage values of the Q current adder inputs to generate the output signal.

6. The charge domain filter as claimed in claim 1, wherein all of the switched-capacitor networks have identical circuits.

7. The charge domain filter as claimed in claim 1, wherein some of the switched-capacitor networks have distinct circuits.

8. The charge domain filter as claimed in claim 1, wherein the switched-capacitor networks have unequal-sized output capacitors.

9. A method determining transfer function of a charge domain filter, comprising
providing a plurality of switched-capacitor networks each having an input terminal and an output terminal, wherein the input terminals of all of the switched-capacitor networks are connected together to be coupled to an input signal, and the switched-capacitor networks are interleaving controlled;
providing a current adder which receives at least one current adder input to output an output signal; and
determining connections between the output terminals of the switched-capacitor networks and how the output terminals of the switched-capacitor networks are coupled to the current adder to provide the at least one current adder input, and thereby determining a transfer function between the input signal and the output signal.

10. The method as claimed in claim 9, wherein the output terminals of every P of the switched-capacitor networks are connected together, and the output terminals of the switched-capacitor networks are individually couples to the current adder to provide M current adder inputs, M is a total number of the switched-capacitor networks, P is a factor of M, and the every P switched-capacitor networks having connected output terminals are operated in an interleaving form.

11. The method as claimed in claim 10, wherein the current adder sums up voltage values of the M current adder inputs to generate the output signal.

12. The method as claimed in claim 9, wherein the output terminals of every P of the switched-capacitor networks are connected together to generate Q current adder inputs for the current adder, P and Q are integers, P is greater than 1 and a product of P and Q equals to a total number of the switched-capacitor networks, and the every P switched-capacitor networks having connected output terminals are operated in an interleaving form.

13. The method as claimed in claim 12, wherein the current adder sums up voltage values of the Q current adder inputs to generate the output signal.

14. The method as claimed in claim 9, wherein all of the switched-capacitor networks have identical circuits.

15. The method as claimed in claim 9, wherein some of the switched-capacitor networks have distinct circuits.

16. The method as claimed in claim 9, wherein the switched-capacitor networks have unequal-sized output capacitors.

* * * * *